(12) United States Patent
Lachapelle

(10) Patent No.: US 11,122,713 B1
(45) Date of Patent: Sep. 14, 2021

(54) DIFFERENTIAL TEMPERATURE BASED PRESSURE SENSING AND AIRFLOW CONTROL

(71) Applicant: Amazon Technologies, Inc., Seattle, WA (US)

(72) Inventor: Alan Joseph Lachapelle, Reston, VA (US)

(73) Assignee: Amazon Technologies, Inc., Seattle, WA (US)

( * ) Notice: Subject to any disclaimer, the term of this patent is extended or adjusted under 35 U.S.C. 154(b) by 373 days.

(21) Appl. No.: 16/014,508

(22) Filed: Jun. 21, 2018

(51) Int. Cl.
| G01K 1/14 | (2021.01) |
| H05K 7/20 | (2006.01) |
| G01K 1/02 | (2021.01) |
| G05B 13/02 | (2006.01) |

(52) U.S. Cl.
CPC ......... *H05K 7/20836* (2013.01); *G01K 1/026* (2013.01); *G01K 1/14* (2013.01); *G05B 13/024* (2013.01); *H05K 7/20745* (2013.01)

(58) Field of Classification Search
CPC ........... H05K 7/20836; H05K 7/20745; G01K 1/026; G01K 1/14
See application file for complete search history.

(56) References Cited

U.S. PATENT DOCUMENTS

| 4,547,079 | A | * | 10/1985 | Alamprese | ............. | G01K 13/02 374/116 |
| 4,646,964 | A | | 3/1987 | Parker et al. | | |
| 5,031,515 | A | | 7/1991 | Niemela et al. | | |
| 6,041,853 | A | | 3/2000 | Edayoshi et al. | | |
| 6,450,024 | B1 | * | 9/2002 | McCulloch | ........... | G01F 1/6965 73/204.25 |
| 9,354,158 | B1 | * | 5/2016 | van Dijk | ................. | B23P 19/00 |
| 10,010,014 | B1 | | 6/2018 | Lachapelle et al. | | |
| 10,165,710 | B1 | | 12/2018 | Pompei et al. | | |
| 10,736,241 | B1 | * | 8/2020 | Lachapelle | ........ | H05K 7/20836 |
| 2010/0139887 | A1 | * | 6/2010 | Slessman | ........... | H05K 7/20763 165/67 |

(Continued)

OTHER PUBLICATIONS

"Averaging Series: Installation & Operating Instructions", Automation Components, Inc. , Workaci.com (Year: 2015).*

(Continued)

*Primary Examiner* — Michael D Masinick
(74) *Attorney, Agent, or Firm* — Kilpatrick Townsend & Stockton LLP

(57) ABSTRACT

An insert for monitoring pressure changes between a cold environment and a hot environment, such as a cold aisle/hot aisle cooling system, includes a conduit having two separated openings, and a frame configured for placement between the hot environment and cold environment. One or more temperature sensors are positioned within the conduit proximate to both of the openings, and configured to sample a first temperature corresponding to the cold environment near the first opening and a second temperature associated with the hot environment near the second opening. In a cooling system, the insert can be used in conjunction with a controller to receive temperature data associated with the first and second temperatures, and determine, based on the temperature data, a direction of flow of air flowing in the conduit and a degree of overpressure or underpressure associated with the cold environment.

13 Claims, 11 Drawing Sheets

(56) References Cited

U.S. PATENT DOCUMENTS

| | | |
|---|---|---|
| 2010/0141063 A1 | 6/2010 | Oh et al. |
| 2010/0235003 A1* | 9/2010 | Maly ................. G06F 1/206 |
| | | 700/276 |
| 2011/0018206 A1 | 1/2011 | Beele |
| 2012/0167670 A1 | 7/2012 | Bean et al. |
| 2012/0224976 A1* | 9/2012 | Nagamatsu ........ H05K 7/20209 |
| | | 417/1 |
| 2012/0279233 A1 | 11/2012 | Chainer et al. |
| 2013/0128455 A1* | 5/2013 | Koblenz ............ H05K 7/20836 |
| | | 361/692 |
| 2013/0307225 A1 | 11/2013 | Boyd |
| 2014/0049905 A1 | 2/2014 | Manzer |
| 2014/0083660 A1 | 3/2014 | McDermott |
| 2014/0120825 A1 | 5/2014 | Lin et al. |
| 2014/0298839 A1* | 10/2014 | Nagamatsu ........ H05K 7/20209 |
| | | 62/186 |
| 2014/0330447 A1 | 11/2014 | Vangilder et al. |
| 2015/0031282 A1 | 1/2015 | Nagan |
| 2015/0036293 A1* | 2/2015 | Martini ............. H05K 7/20745 |
| | | 361/695 |
| 2016/0195856 A1 | 7/2016 | Spero |
| 2017/0087956 A1 | 3/2017 | Graaf et al. |
| 2018/0037092 A1 | 2/2018 | Lin et al. |
| 2018/0063997 A1 | 3/2018 | Klein |
| 2020/0049540 A1* | 2/2020 | Reepmeyer ............ G01F 1/692 |

OTHER PUBLICATIONS

U.S. Appl. No. 15/872,596, filed Jan. 16, 2018; Titled: "Temperature Based Pressure Sensing and Airflow Control".

* cited by examiner

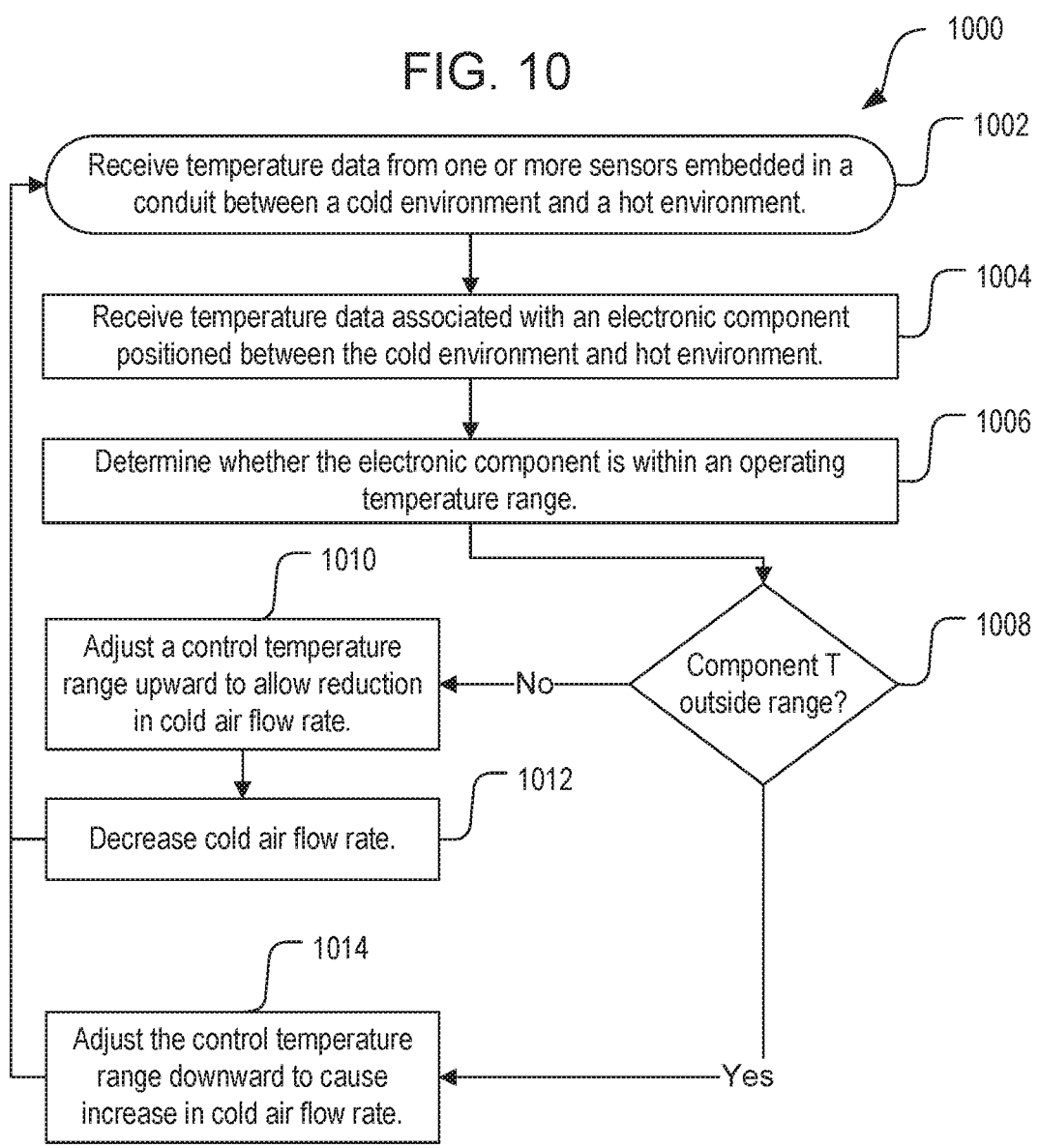

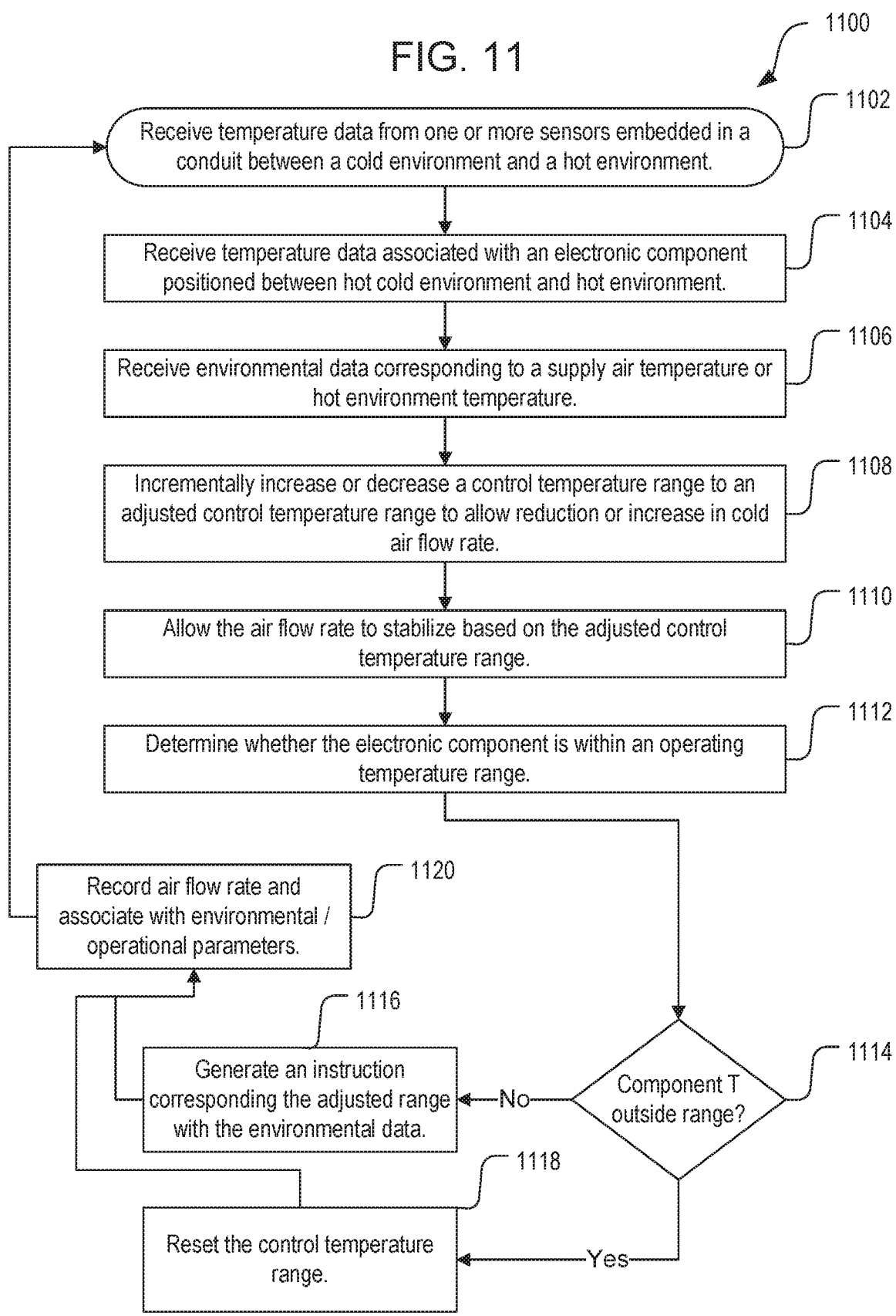

DIFFERENTIAL TEMPERATURE BASED PRESSURE SENSING AND AIRFLOW CONTROL

BACKGROUND

A datacenter typically contains a collection of computer servers and components for the management, operation and connectivity of those servers. Even in isolation, datacenter electronic components may generate sufficient heat that temperature management is important to prolong the life of the components and smooth and continuous operation of the datacenter.

Datacenter electronic components are often arranged together. For example, datacenter electronic components can be vertically arranged in racks or within server cabinets. When heat-generating electronic components are arranged together, however, the cumulative generation of heat can increase the ambient temperature and exacerbate the challenge of managing the temperature of individual components.

Datacenter electronic components may be cooled by passing air through the components. In some cases, this cooling is achieved by having individual components or groups of components equipped with fans that push air through the components. The effectiveness of a cooling system is related to the rate of airflow past the heat-generating components and the relative temperature of the air as it passes through the system. Therefore it can be advantageous to carefully control airflow to drive cool air where it is most needed and to efficiently exhaust hot air from the system. One such system for controlling airflow in a cooling system is a hot aisle/cold aisle system, which employs contained aisles to direct cooling air into the components. The pressurization of the cold aisle with cooling air can help to improve the efficiency of the system at cooling each component, and reduce the amount of work required of local fans. However, improved methods of monitoring and correcting temperature and pressure fluctuations are needed.

BRIEF DESCRIPTION OF THE DRAWINGS

Various embodiments in accordance with the present disclosure will be described with reference to the drawings, in which:

FIG. 10 illustrates a third example process for controlling a cooling system employing differential temperature-based pressure monitoring in conjunction with one or more differential temperature-based pressure monitoring inserts; and FIG. 11 illustrates a fourth example process for controlling a cooling system employing differential temperature-based pressure monitoring in conjunction with one or more differential temperature-based pressure monitoring inserts.

DETAILED DESCRIPTION

Figure 1:
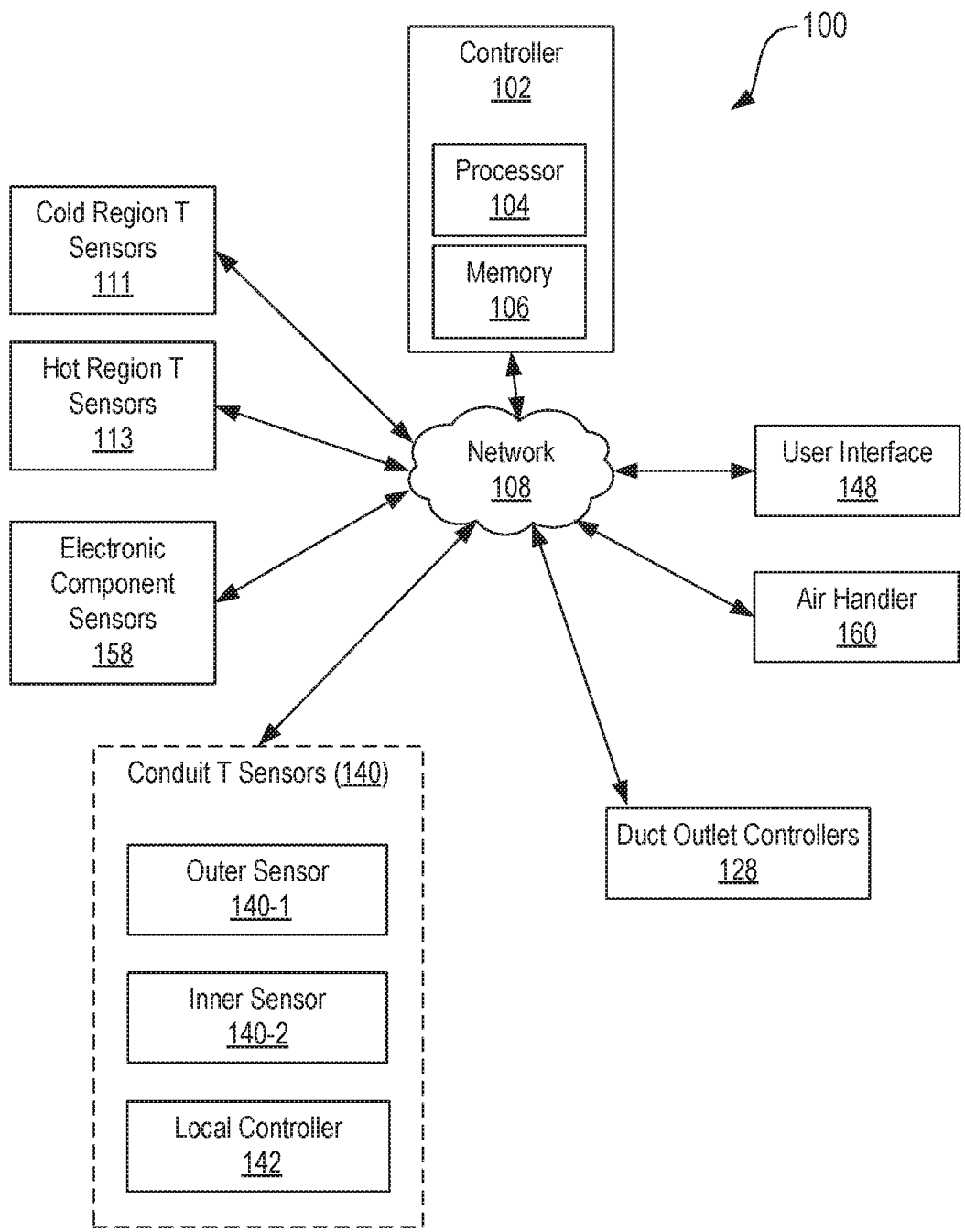
FIG. 1 is a simplified block diagram illustrating a system for differential temperature-based pressure monitoring in a hot aisle/cold aisle cooling system, in accordance with various embodiments.

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

In accordance with various embodiments of the present disclosure, a conduit is installed in a containment element that separates a cold environment, such as a cold aisle, from a hot environment. When applied in a hot aisle/cold aisle system, such as a datacenter cooling system, the conduit provides a route for a small amount of air to bypass electronic component racks installed between the hot aisle and cold aisle. By using sensors positioned in the conduit, the cooling system can detect temperature data corresponding to the air passing through the conduit, and use these data to determine whether sufficient cold air is being delivered to the cold environment.

In some embodiments, the sensing is performed by way of an elongate averaging sensor positioned in the conduit that extends to both the cold environment and hot environment through the conduit. The averaging sensor provides several advantages over using a single sensor in the conduit. For example, the averaging sensor provides temperature data based on the air temperature of a flow of air around the entire length of the sensor, which will vary depending on the rate at which cold air flows around the sensor from the cold aisle to the hot aisle; or on the rate at which hot air flows from the hot environment back into the cold aisle if recirculation is occurring. Thus, a system using an averaging sensor can detect not just whether recirculation has occurred, but can also indirectly measure the rate at which air is flowing and, therefore, a degree by which the cold environment is over- or under-pressurized. In general, an appropriate rate of airflow across the conduit will be indicated by an average temperature that is lower than the temperature of the hot environment but higher than the temperature of the supply of cold air.

The averaging sensor can be used in a temperature/pressure control scheme by measuring the temperature of the supplied cold air and/or the temperature of the hot environment, and setting a temperature range or set-point based on the supplied cold air temperature and/or the hot environment temperature. For example, in one such control scheme, the condition where cold air is flowing through the conduit at a high rate indicates overpressure in the cold environment, the condition where hot air is recirculating through the conduit to the cold environment indicates underpressure, and the condition where cold air is flowing through the conduit slowly indicates that the system is supplied with an appropriate amount of cold air. The control scheme can set a threshold temperature or temperature range that falls between the cold environment and hot environment temperatures, and control the flow rate of cold air to the cold environment based on a comparison of the temperature at the averaging sensor to the threshold temperature or temperature range. If the measured temperature is below the threshold temperature or range, the system can instruct an air handler to decrease the amount of airflow to the system; and if the measured temperature is above the threshold temperature or temperature range, the system can instruct the air handler to increase the amount of airflow to the system. According to some embodiments, airflow can also be controlled locally, e.g. by adjusting flow rates through individual cold air outlets along the cold environment, or can be controlled globally, e.g. at a common air handler for a cold environment, or at an air supply for more than one cold environment.

In various other embodiments, temperature sensing in a conduit is performed by two sensors positioned within but near the ends of the conduit. The distance of the sensors from each other can be modified to adjust the sensitivity of the system to pressure changes, and portions of the conduit near the sensors may be perforated to allow the local environment to influence the sensors. The pair of sensors can be used in a similar manner to an averaging sensor by obtaining an average of the temperature data from each sensor. Alternatively, a cooling system can compare the temperature data from each of the two sensors to a threshold temperature, temperature range, or to different temperature ranges separately. For example, if both sensors detect air at a high temperature relative to the cold environment or supplied flow of cold air, the reading indicates that air is recirculating from the hot environment, and the system can respond by increasing the rate at which cold air is delivered. If both sensors detect air at a temperature near that of the cold environment, the reading indicates that cold air is oversupplied and the system can respond by decreasing the rate at which cold air is delivered. If the system detects a delta between the temperatures, the reading indicates that air is being delivered at or near an optimum rate that balances pressure across the conduit. In specific embodiments, the threshold temperature or temperature range can be set slightly below the average of the cold environment and hot environment temperatures, so that the balanced condition provides slight pressurization resulting in low to moderate flow from the cold environment to the hot environment.

In some embodiments, the control system and processes can include machine learning techniques, whereby the system monitors the amount of cold airflow increase required to bring the system to a balanced condition under a variety of specific conditions. For example, such systems can include numerous additional factors such as the supplied cold air temperature, the hot environment temperature, latent conditions of the supplied air other than temperature, and the temperature readings of the electronic devices that are cooled by the system. For example, servers demand a higher rate of airflow when the supplied air is hotter, and the temperature indicated by on-board temperature sensing will indicate whether the servers or other electronic devices are being adequately cooled. Machine learning can be applied in concert with periodic adjustments to the temperature thresholds or ranges, and can allow the system to anticipate increases or decreases in demand based on factors other than just the sensed temperature or temperatures in the conduit.

Turning now to the figures, in which like numbering indicates like elements, FIG. 1 is a simplified block diagram illustrating a system 100 for differential temperature-based pressure monitoring in a hot aisle/cold aisle cooling system, in accordance with various embodiments. The system 100 includes a controller 102 having at least one processor 104 and nontransitory memory 106 that, when accessed by the processor, contain instructions for managing components of the system. The controller can communicate with the various components of the system 100 by way of a network 108, which can be any suitable form of wireless network (e.g. Bluetooth, WiFi, or the like) or wired network, or combination, including direct connection between the controller 102 and any suitable component.

Various environmental sensors can communicate temperature information with the controller 102, e.g. cold environment temperature sensors 111 for monitoring the temperature inside the cold environment or cold aisle, hot environment temperature sensors 113 for measuring an external temperature in the hot environment outside the cold environment, air supply temperature sensors 123 for measuring the instantaneous temperature of the flow of cold air being supplied by an air handler, and electronic component sensors 158 associated with server racks, transfer switches, or other heat-generating electronic components that are cooled by the flow of cold air in the cold environment 210.

The system 100 can also control flow rates of cold air to the cold environment. This control can be exerted across the entire cold environment by, e.g., increasing or decrease a rate of delivery of the flow of cold air by an air handler 160; or can be exerted locally at locations along the cold environment by way of individual duct outlet controllers 128.

Figure 2:
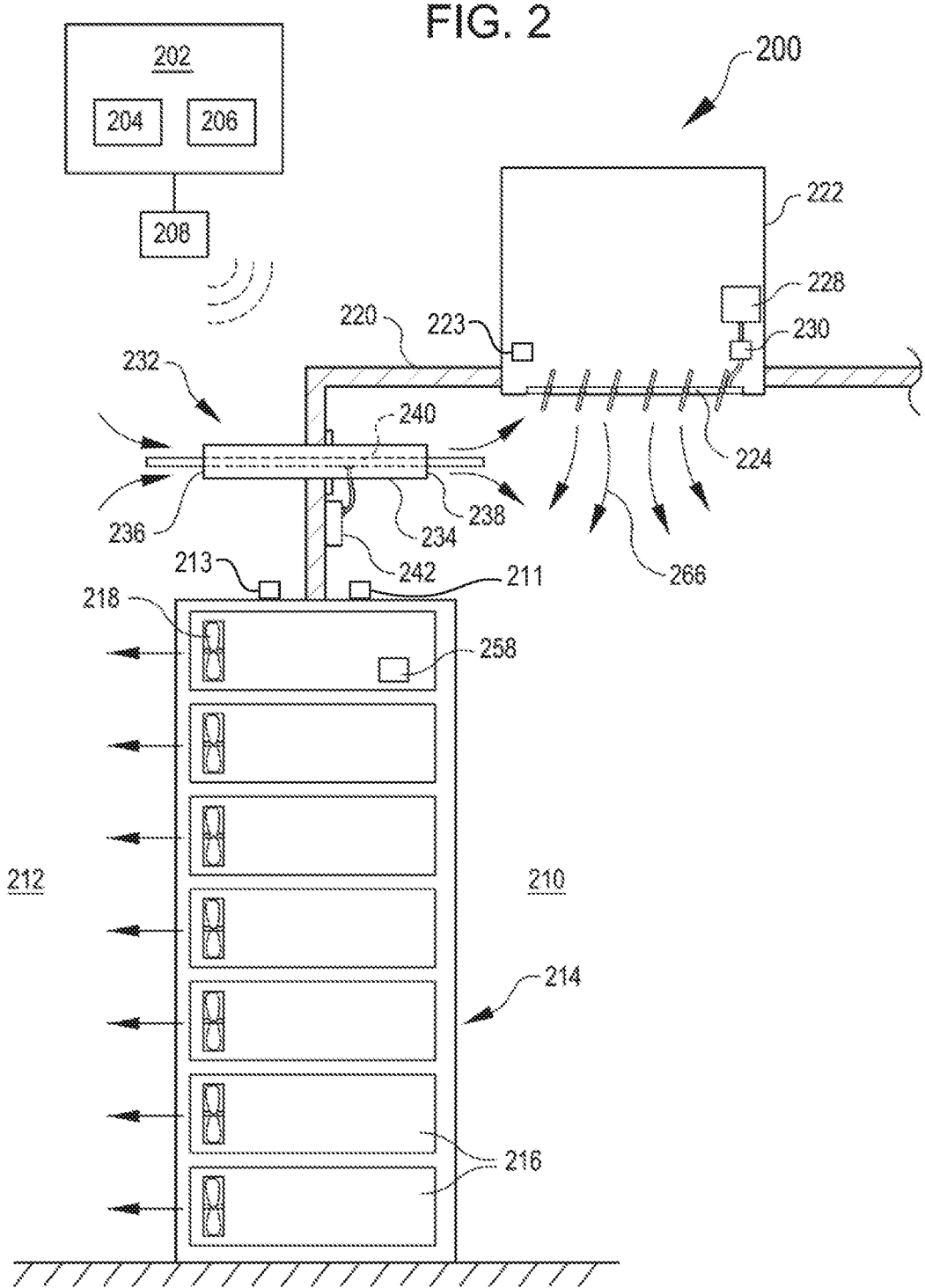
FIG. 2 is a side view diagrammatical illustration of a hot aisle/cold aisle system employing a differential temperature-based pressure monitoring insert, in accordance with various embodiments.

FIG. 2 is a side view diagrammatical illustration of a hot aisle/cold aisle system 200 employing a differential temperature-based pressure monitoring insert 232, in accordance with various embodiments. The system 200 includes a controller 202 (analogous to controller 102, FIG. 1) that includes at least one processor 204 and memory 206, which is operably connected with and able to control or collect data from the various components of the system 200 by way of a network device 208, such as a wireless communication device or a wired connection. The system 200 includes an electronic component enclosure 214 containing multiple heat-generating electronic components 216, such as servers, computing devices, power control devices, or the like, each of which typically has an associated component 218 for exhausting heat locally.

A cold environment sensor 211 can be positioned in the cold environment 210 for taking temperature readings of the cold environment, and a hot environment sensor 213 positioned in the hot environment 212. In addition, the system 200 can include component sensors 258 in one or more of the electronic components 216 for collecting temperature information at the components, as well as air supply temperature sensors 223 at the duct 222 for detecting a temperature of the flow of cold air 266 prior to mixing with the cold environment 210. The flow of cold air 266 is supplied to the cold environment by the cold air duct 222 and cold air outlet 224.

A containment element 220, in conjunction with the component rack 214 or racks, encloses the cold environment 210. This enclosure allows the flow of cold air 266 from the cold air outlet 224 to pressurize the cold aisle 210 and flow out through the heat-generating electronic devices 216. In various embodiments, the monitoring insert 232 is placed through the containment element 220 and allowed to project into the hot environment 212 and cold environment 210. The insert 232 includes a conduit 234 having an external opening 236 to the hot environment 212 and an internal opening 238 to the cold environment 210. The conduit 234 contains at least one temperature sensor 240 for measuring the temperature of air flowing through the conduit. In various embodiments, the temperature sensor 240 is an elongate, averaging temperature sensor that is operable to directly obtain an average temperature across the length of the conduit. However, in other embodiments, multiple sensors within the conduit 234 may be used.

According to some embodiments, the system 200 can include dampers 226, which can be actuated by a damper actuator 230 under the control of a damper controller 228 to locally alter the rate at which the flow of cold air 266 exits the cold air outlet 224. For systems including multiple cold air outlets 224 along a length of the cold environment 210, such control methods may locally adjust pressure or temperature in the cold environment. The system 200 can also control the rate at which cold air is distributed to the entire cold environment 210.

The elongate averaging sensor 240 can be fully enclosed within the conduit 234, or can extend outward from each opening 236, 238. In most embodiments, the elongate averaging sensor 240 extends to a position proximate each of the openings 236, 238. The exact positioning can vary depending on the desired sensitivity of the system, but in general, "proximate" as used herein indicates that each end of the elongate sensor 240 is positioned sufficiently close to the openings 236, 238 that air outside the conduit 234 can interact to a limited degree with the sensor, and that each end of the elongate sensor is closer to its respective opening than to the other end of the sensor. More particularly, the sensor typically extends by no more than ¼ of a length of the conduit 234, if projecting outside; or extends to at least ¼ of a length of the conduit from each opening, if inside. The extent by which the averaging sensor 240 projects from each opening 236, 238 can be adjusted to tune the sensitivity of the monitoring insert, with more extension yielding a less sensitive system and therefore a more stable control system, i.e. one that is less prone to overshooting a target pressure or temperature. In some specific embodiments, the averaging sensor 240 projects up to ¼ of the length of the conduit from each opening 236, 238, e.g., up to 3/16, up to ⅛, or up to 1/16 of the length of the conduit. In some embodiments, the averaging sensor 240 can project up to ⅓ of the length of the conduit 234 from one or both ends 236, 238. The elongate averaging sensor 240 can be an elongated thermocouple, thermistor, or other comparable electronic temperature sensor, and can take the form of an elongated wire or wire pair, conductive rod, or other suitable structure. In some embodiments, a local controller 242 can be connected with the averaging sensor 240 in order to communicate data with the controller 202, or to provide a user interface for presenting information to an operator.

The averaging sensor 240 will measure a temperature that falls between the temperature of the cold environment 210 and the hot environment 212. The temperature reading can also be indicative of the velocity of the air through the conduit 234 and thus indicative of the degree of over- or under-pressurization in the cold environment 210. For example, when the average temperature in the conduit 234 is very close to the temperature of the cold environment 210, (e.g., within 1-2° C.) the measurement indicates a high velocity of air flowing from the cold environment 210 to the hot environment 212, signaling over-pressurization in the cold environment. Conversely, when the measured temperature in the conduit 234 is very close to the temperature of the hot environment 212, the measurement indicates rapid recirculation from the hot environment back to the cold environment, which signals under-pressurization in the cold environment. A measured temperature near an average of the cold- and hot-environment temperatures is indicative of low airflow in the conduit 234, and therefore a pressurization regime that is less extreme. A specific average temperature across the conduit 234 that is indicative of optimal cooling can be determined as a function of the cold environment temperature and hot environment temperature, and can be used as a target when those temperatures are known.

Figure 3:
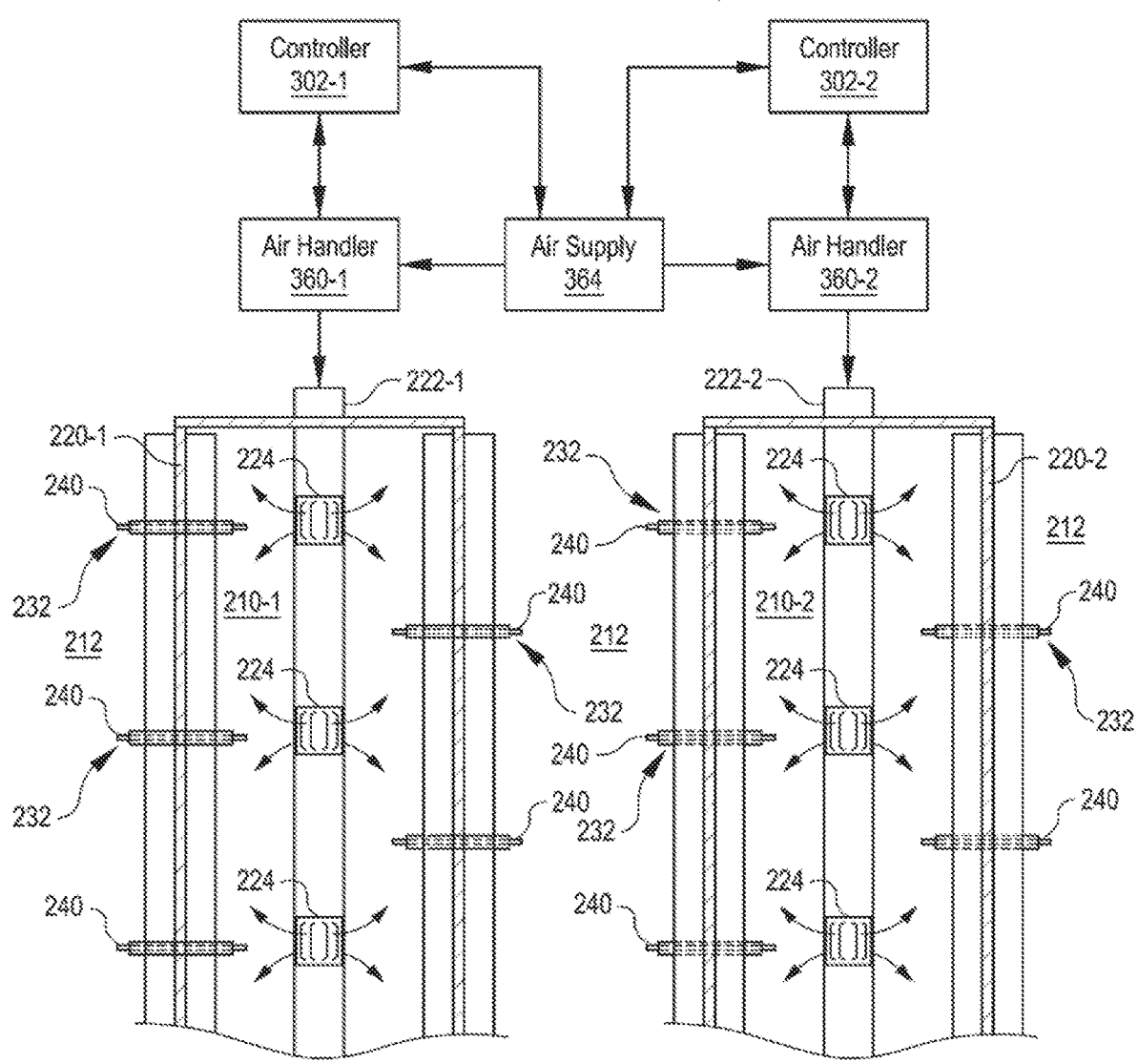
FIG. 3 is a top view diagrammatic illustration of a hot aisle/cold aisle system employing an array of differential temperature-based pressure monitoring inserts, in accordance with various embodiments.

FIG. 3 is a top view diagrammatic illustration of a hot aisle/cold aisle system 300 employing an array of differential temperature-based pressure monitoring inserts and features of the system 200 of FIG. 2, in accordance with various embodiments.

The system 300 is analogous to system 200 described above with respect to FIG. 2, showing a hot environment 212 containing cold aisles 210-1, 210-2 in a repeating arrangement, with multiple temperature monitoring inserts 232 and cold air outlets 224 associated with each cold aisle. The cold aisles 210 are contained by two containment elements 220-1, 220-2, in conjunction with the electronic component racks 214 (FIG. 2).

A first cold air duct 222-1 receives a flow of cold from a first air handler 360-1 associated with the first cold aisle 210-1, and pushes the flow of cold air to a first series of the cold air outlets 224 under the control of a first controller 302-1. A similar configuration can be used to manage airflow to the second cold aisle 210-2, including a second controller 302-2, air handler 360-2, cold air duct 222-2, and enclosure 220-2. Alternatively, any suitable number of cold aisles 210 can be managed by a single controller 302. Generally, a common air supply 364 will provide a source of cold air to multiple air handlers 360 for distribution, but in some cases multiple air supplies can be used. Suitable air supplies 364 can include, but are not limited to: direct environmental intake, a flow of environmental or recycled air subjected to evaporative cooling, or mechanically cooled air.

A variety of alternative arrangements of cold air outlets 224 are possible and within the spirit of this disclosure, including embodiments having an arbitrary number of cold air outlets depending on the length of the cold aisle and the frequency with which cold air outlets are needed to adequately pressurize the aisle. Similarly, any suitable number of temperature monitoring inserts 232 can be positioned along the containment elements 220-1, 220-2 at any suitable spacing. In some embodiments, as few as one monitoring insert 232 can be used. In some embodiments, two or more monitoring inserts 232 can be positioned within the containment elements 220-1, 220-2, generally including at least two monitoring inserts located near ends of the containment elements 220-1, 220-2. In the illustrated example system 300, and in at least some other embodiments, five inserts 232 are positioned in a distributed manner at regular intervals along each containment element 220-1, 220-2 as shown in FIG. 3.

Each of the monitoring inserts 232 includes an averaging sensor 240 (or sensor pairs as described in FIG. 7) that is configured to detect the temperature of air flowing between each cold environment 210-1, 210-2 and the hot environment 212. In at least some embodiments, the number of monitoring inserts required for monitoring pressure in a cold environment, like a cold isle, is on the order of 1-5, with the sensors positioned to obtain representative temperature data from different parts of the cold environment; but specific control systems may use more or fewer sensors depending on the length of the cold aisles and the required degree of control.

Figure 4:
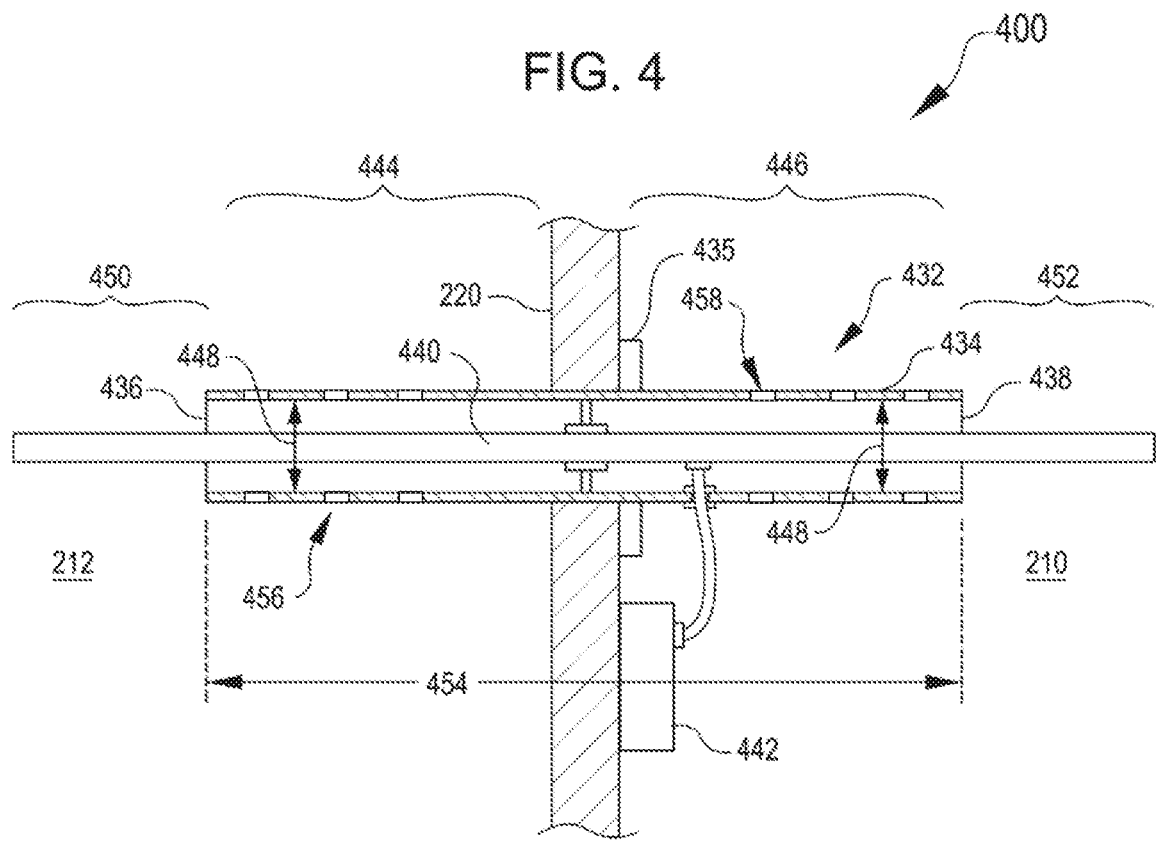
FIG. 4 is a detailed side view diagrammatical illustration of an example differential temperature-based pressure monitoring insert with an averaging temperature sensor positioned in a containment element.

FIG. 4 is a detailed side view diagrammatical illustration of an example differential temperature-based pressure monitoring insert 432 for a cold aisle/hot aisle system 400 in greater detail, with an averaging temperature sensor 440 positioned in a containment element 220, similar to the containment elements of FIGS. 2-3. The monitoring insert 432 is positioned through a containment element 220 separating a cold environment 210 from the hot environment 212, and includes a conduit 434 through which air can flow in either direction. A flange 435 or other sealing features may be connected with the conduit 434 in order to prevent leakage of air around the monitoring insert 432. The conduit 434 opens to the hot environment 212 by an exterior opening 436 and to the cold environment 210 by an interior opening 438, and an elongate averaging sensor 440 is positioned through conduit 234 and extending outwardly from both of the openings 436, 438.

The conduit 434 can project externally from the containment element 220 by an external extension 444, and internally by an internal extension 446. The external extension is generally about 10-15 cm. In accordance with various embodiments, the internal extension 446 can vary more markedly, with a minimum extension from about 10-15 cm, up to about 140 cm (i.e., 4" to about 4.5'), though the upper bound is generally limited by the expected pressure drop across the length of the conduit 454, and accordingly, can vary with the conduit diameter 448. A total length of the conduit 454 can range from about 20 cm (8") up to about 150 cm (5'), and the internal diameter 448 can range from about 3 mm up to about 25 mm (⅛" to 1"). In some embodiments, an internal diameter, width, or other internal dimension of the conduit can vary from about 1:96 with respect to the length of the conduit 454 up to about 1:4.

The elongate averaging temperature sensor 440 can extend from the first and second ends by a distance suitable for encouraging some influence of the local air temperature in the cold and hot environments 410, 412. The extensions 450, 452 of the averaging sensor 440 can depend on the sensitivity of the desired system, with longer averaging sensors resulting in less sensitivity, which increases the stability of the control system. For example, in some embodiments, the extensions 450, 452 of the temperature sensor 440 can have lengths up to ¼ of the conduit length 454, or in some embodiments, up to ⅓ of the conduit length. For example, in a specific embodiment, the conduit can have a length of up to 20 cm (8") and the temperature sensor 440 can have a length of up to 30 cm (12"), with each extension being 5 cm. In another embodiment, the conduit 434 can have a conduit length 454 of up to 150 cm (about 5') with temperature sensor extensions 450, 452 of about 15 cm (about 6"). In various embodiments, the conduit length 454 can vary from about 20-150 cm, with sensor extensions 450, 452 that can vary from about 5 cm to 15 cm. The degree by which the averaging temperature sensor 440 extends from the conduit 432 can vary depending on multiple factors including, for example, the degree of influence from the hot and cold environments 212, 210 desired for controlling the temperature of the cold environment, with greater extension corresponding to decreased sensitivity to temperature change, and less extension (or negative extension, with the averaging sensor internal to the conduit) corresponding to increased sensitivity.

Figure 7:
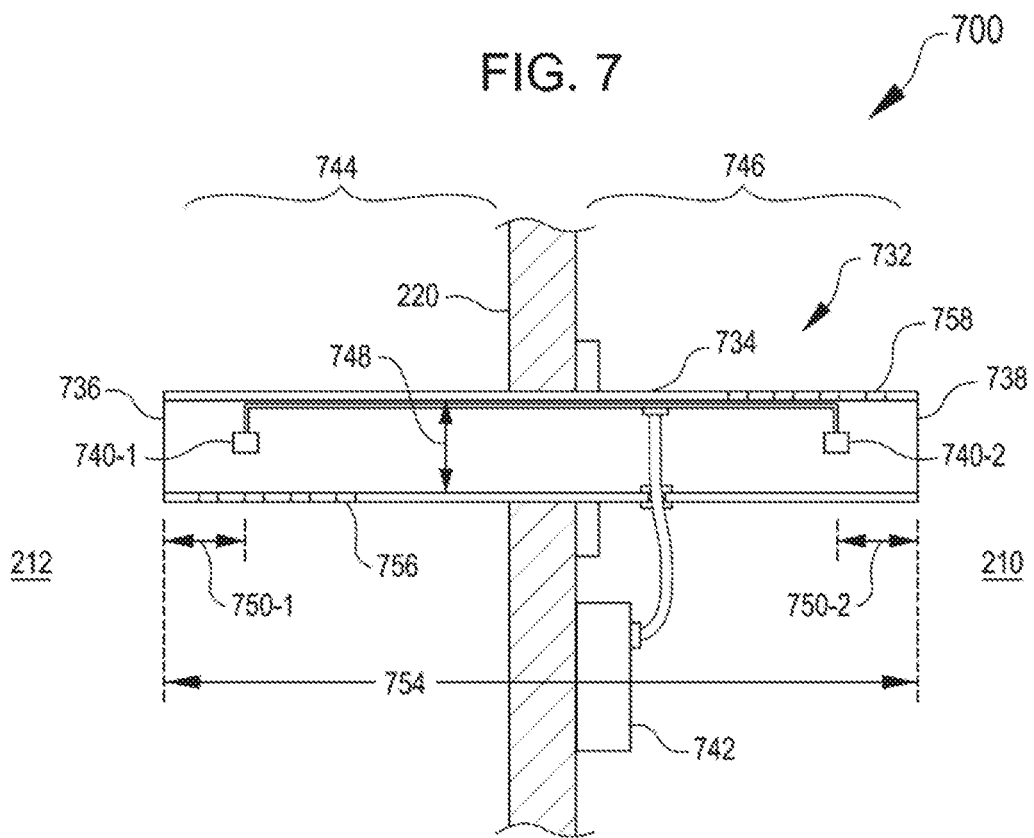
FIG. 7 is a side view diagrammatical illustration of a second example of a differential temperature-based pressure monitoring insert employing two separated temperature sensors and positioned through a containment element.

In some embodiments, the conduit 434 can be modified by the addition of perforations 456, 458 to one or both ends of the conduit near the exterior and interior openings 436, 438. Adding perforations to the conduit can further decrease the sensitivity of an associated control system in order to increase system stability. The perforations can range in diameter from about 3 mm up to about 6 mm (⅛" to ¼"), with spacing on the order of about 12 mm (½"). The perforations 456 proximate to the outer opening 436 can be placed at any positioned along the conduit 434, but generally within about 12-15 cm of the exterior opening 436. Similar inner perforations 458 can also be placed along the conduit 434 near the interior opening 438, but generally within about 12-15 cm of the interior opening. In some embodiments, the perforations 456. 458 may be positioned symmetrically about the conduit 434 at each end; but the perforations may also be placed asymmetrically. For example, in some embodiments, the perforations 456, 456 are placed generally along a bottom portion of the conduit 434, or along the top of the conduit. The perforations 458, 458 can be symmetrical with respect to one another, or can be asymmetric, e.g., with the exterior perforations 456 placed along the bottom of the conduit 434 and the interior perforations 458 along the top, or with the exterior perforations 456 placed along the top of the conduit 436 and the interior perforations 458 along the bottom. The positioning, size, and symmetry or asymmetry of the perforations can help tune the sensitivity of the system 400 by changing how airflow patterns around the openings 436, 438 interact with the sensor 440. An asymmetric example is shown in FIG. 7, in conjunction with an example monitoring insert 732 employing multiple sensors. It will be understood that each example perforation scheme as described above can be employed with both elongate sensors (e.g. sensor 440) or multiple discrete sensors (e.g. sensors 740-1, 740-2, FIG. 7).

Figure 5:
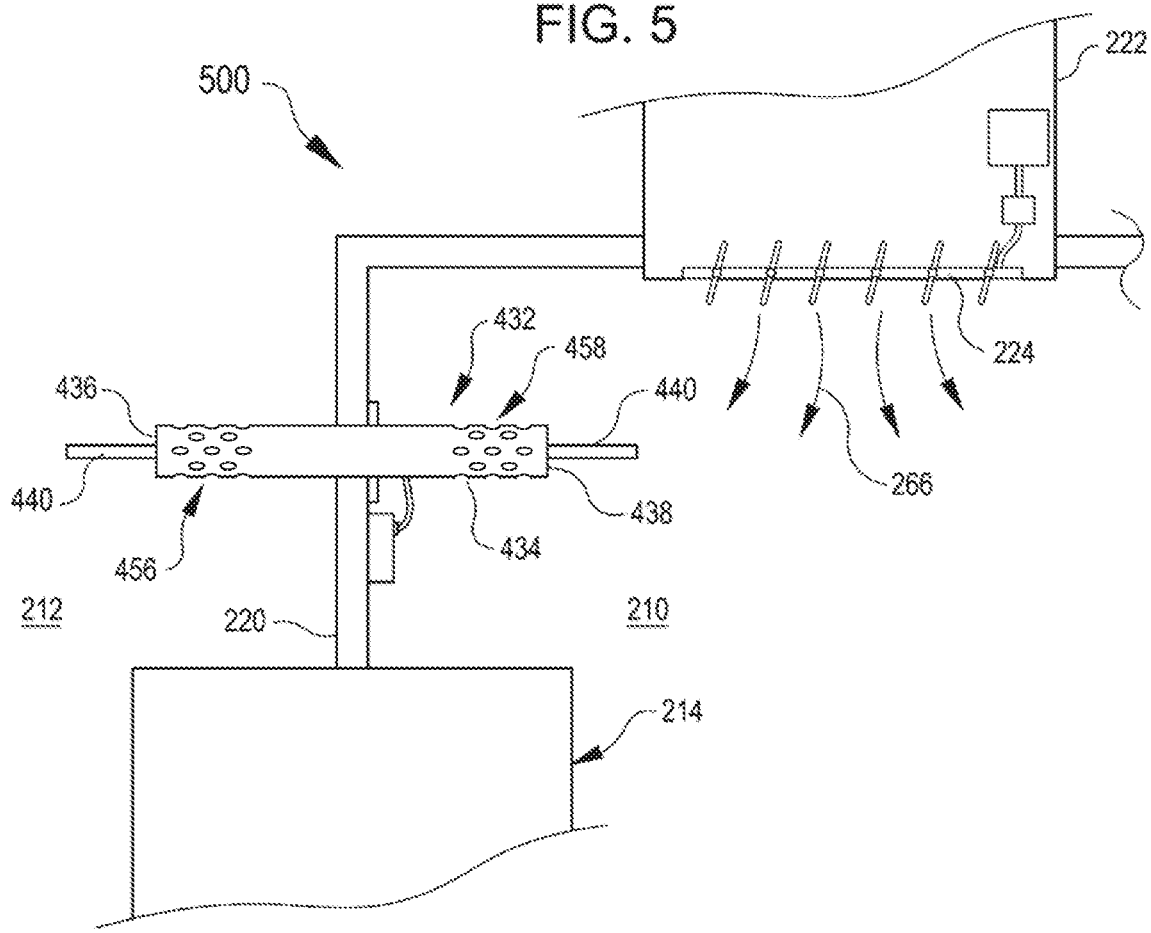
FIG. 5 is a side view diagrammatical illustration of a hot aisle/cold aisle system in detail employing the example insert of FIG. 4.

FIG. 5 is a side view diagrammatical illustration of a hot aisle/cold aisle system 500 in employing the example insert 432 of FIG. 4. The system 500 includes the electronic component enclosure 214 and containment element 220 separating the cold environment 210 from the hot environment 212. The duct 222 provides a flow of cold air 266 that pressurizes the cold environment 210 from the cold air outlet 224.

As shown, the monitoring insert 432 can be positioned through the containment element 220, generally above the electronic component enclosure 214, with the conduit 434 in fluid communication with both the cold aisle 210 by way of the inner opening 438 and the hot environment 212 by way of the outer opening 436. The elongate averaging sensor 440 extends out of both the inner and outer openings 438, 436. Optional perforations 456 and 458 are shown extending along a portion of each end of the conduit 434, with the outer perforations 456 positioned on the underside of the conduit and the inner perforations 458 positioned along the top of the conduit.

Figure 6:
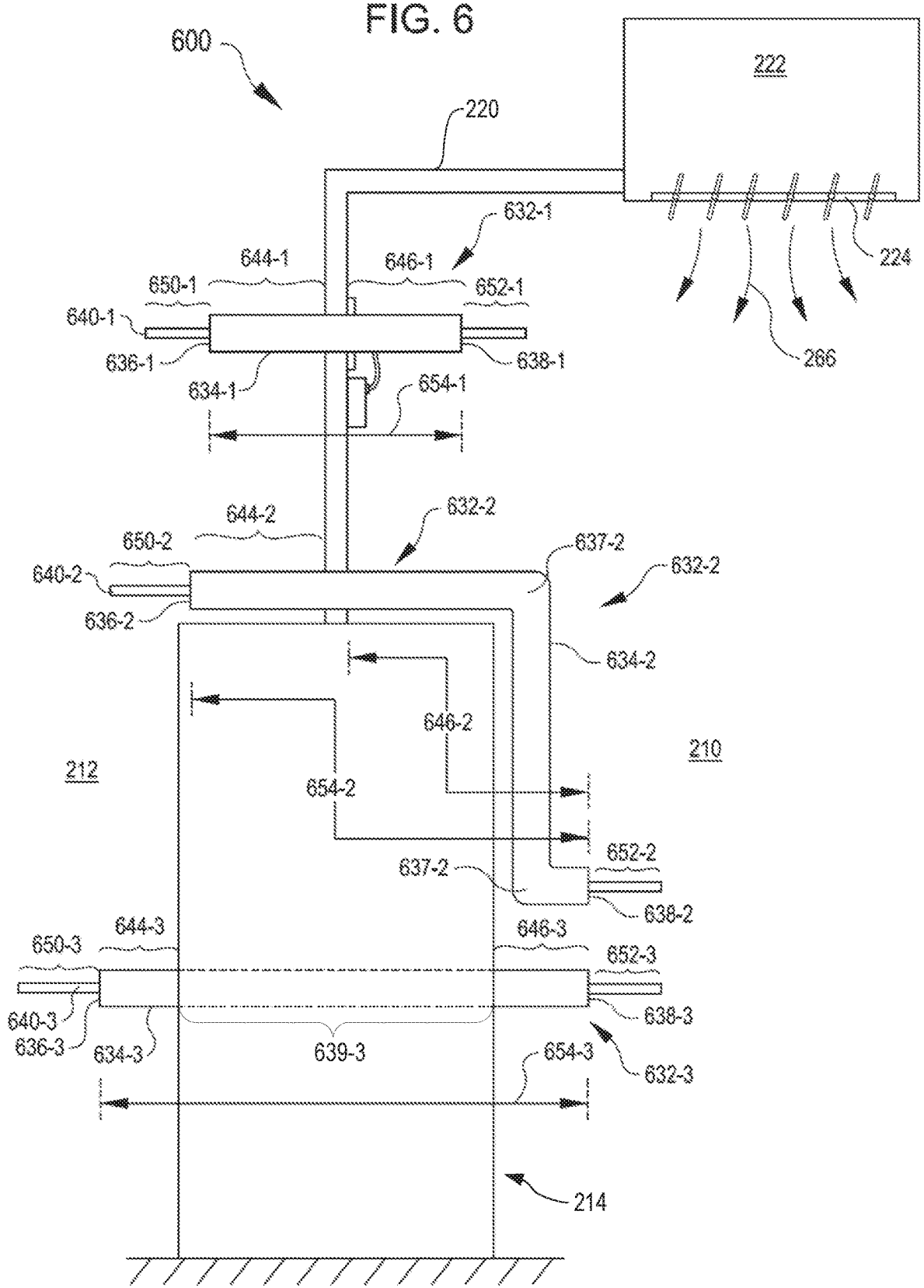
FIG. 6 is a side view diagrammatical illustration showing a hot aisle/cold aisle system with various configurations of a differential temperature-based pressure monitoring insert.

Monitoring inserts as described above with reference to FIGS. 2-5 have been shown passing through a narrow containment element 220 and as simple linear tubes. However, various alternative geometries and positions of the monitoring inserts are possible. FIG. 6 is a side view diagrammatical illustration showing a hot aisle/cold aisle system 600 with various configurations of differential temperature-based pressure monitoring inserts 632-1, 632-2, and 632-3. The system 600 includes a cold environment 210, hot environment 212, and an electronic component rack 214 and containment element 220 separating the cold environment from the hot environment. A cold air duct 222 is positioned adjacent the cold environment 210 for delivering a flow of cold air 266 to the cold environment by way of a cold air outlet 224.

In a first configuration of a differential temperature-based pressure monitoring insert 632-1, which is similar to insert 432, the conduit 634-1 passes through the containment element 220 above the electronic component rack 214, and fluidly connects with the hot environment 212 by way of an exterior opening 636-1 and with the cold environment 210 by way of an interior opening 638-1. An elongate averaging sensor 640-1 is positioned within and passing through the conduit 634-1. The conduit 634-1 extends into the hot environment by an external projection 644-1 and into the cold environment by an internal extension 646-1, which are typically at least 15 cm in length. The averaging sensor 640-1 extends from the exterior opening 636-1 by an exterior sensor extension 650-1, and from the interior opening 638-1 by an internal sensor extension 652-1. Both sensor extensions 650-1, 652-1 are generally at least 5 cm, but may be longer. A total conduit length 654-1 is on the order of at least 15 cm in length, but may be longer.

In various alternative configurations, the monitoring inserts may be substantially longer, may have curved or bent features to accommodate their length or wrap around components, or may even pass through alternative elements of the system 600. For example, a second configuration of a differential temperature-based pressure monitoring insert 632-2 can pass around the electronic component rack 214, or otherwise more efficiently occupy space within the cold environment 210 than a straight insert. The insert 632-2 includes a conduit 634-2 with an exterior opening 636-2 and interior opening 638-2 similar to those described above, as well as similar configurations of the sensor 640-2, exterior projection 644-2 and exterior sensor extension 650-2. However, unlike the previous example, insert 632-2 includes a series of bends 637-1 that extend the length 654-2 of the insert along the electronic component rack 214. In this example, the interior extension 646-2 is elongated, and the sensor 640-2 is also elongated so that a suitable interior sensor extension 652 is achieved, also on the order of at least 5 cm, up to about ¼ or ⅓ of the total length 654-2 of the insert 632-2.

A third configuration of a differential temperature-based pressure monitoring insert 632-3 is shown passing through the electronic component rack 214, in accordance with various embodiments. The conduit 634-3 can be extended to place the exterior opening 636-3 in the hot environment 212 and the interior opening 638-3 in the cold environment 210, with an intermediate section 639-3 passing through the component rack 214. An elongate averaging sensor 640-3 can pass through the entire length 654-3 of the conduit 634-3. When installed, the monitoring insert 632-4 can have an external extension 644-3 and internal extension 646-3 on the order of 15 cm in length, and an external sensor extension 650-3 and internal sensor extension 652-3 each on the order of at least 5 cm in length, or more. A total conduit length 654-3 thus exceeds the width of the electronic component rack 214 by at least the sum of the extensions.

FIGS. 2-6 have generally shown embodiments of temperature monitoring inserts that employ an elongate averaging sensor, however, monitoring inserts utilizing multiple point sensors can be used as well. For example, FIG. 7 is a side view diagrammatical illustration of a second example of a differential temperature-based pressure monitoring insert 732 employing two separated temperature sensors 740-1, 740-2 and positioned through a containment element 220 separating a cold environment 210 and a hot environment 212 of an example system 700, in accordance with various embodiments.

The monitoring insert 732, like monitoring insert 432 (FIG. 4), includes a conduit 734 having an exterior opening 736 that is open to the hot environment 212 and an interior opening 738 that is open to the cold environment 210. Instead of an elongate averaging sensor, the insert 732 includes a first sensor 740-1 positioned within the conduit 734 and within about 2.5 cm (1") of the external opening 736, and a second sensor 740-2 positioned within the conduit 734 and within about 2.5 cm (1") of the internal opening 738. A local controller 742, which can include a user interface, can be used by the system 700 to communicate temperature data between a controller (not shown) and the sensors 740-1, 740-2.

In some embodiments, the two-sensor system 700 can be used identically to system employing an averaging sensor by obtaining an average of the temperature readings of the two sensors 740-1, 740-2. However, the use of two distinct sensors can have several advantages. For example, a delta between temperature readings at the two point sensors 740-1 and 740-2 can be measured by comparing the temperature readings obtained from the two sensors. This temperature data obtained by the two sensors can indicate whether air is recirculating through the conduit, e.g., with high values being indicative of recirculation from the hot environment 212 to the cold environment 210; and the delta between the two sensors can indicate the velocity of air flowing through the conduit, with a high delta indicating lower velocities. This delta can be calculated independent of and without necessitating measurements of the cold environment temperature and hot environment temperature.

The insert 732 can have similar dimensions to those of any of the monitoring insert embodiments discussed above including the external extension 744, internal extension 746, internal diameter 748, and total length 754. In general, the first and second sensors 740-1, 740-2 will be set back from the exterior opening 736 and interior opening 738 by a first sensor setback 750-1 and second sensor setback 750-2 of at least 2.5 cm, though in some embodiments, the sensors can be positioned nearer the openings or further into the conduit 734.

In some embodiments, the conduit 734 can be modified by adding perforations 756, 758 to one or both ends of the conduit near the exterior and interior openings 736, 738. Adding perforations to the conduit can further decrease the sensitivity of the system in order to increase system stability. The perforations can range in diameter from about 3 mm up to about 6 mm (⅛" to ¼"), with spacing on the order of about 12 mm (½"). The outer perforations 756 can be placed at any positioned along the conduit 734, but generally within about 12-15 cm of the exterior opening 736, and generally along a bottom portion of the conduit. The inner perforations 758 can also be placed along the conduit 734 near the interior opening 738, but generally within about 12-15 cm of the interior opening, and generally along an upper portion of the conduit. In embodiments that employ perforations, additional mixing of local air near the conduit ends 736, 738 will cause the delta between the first and second temperature readings to further diverge, increasing the stability of the system.

Figure 8:
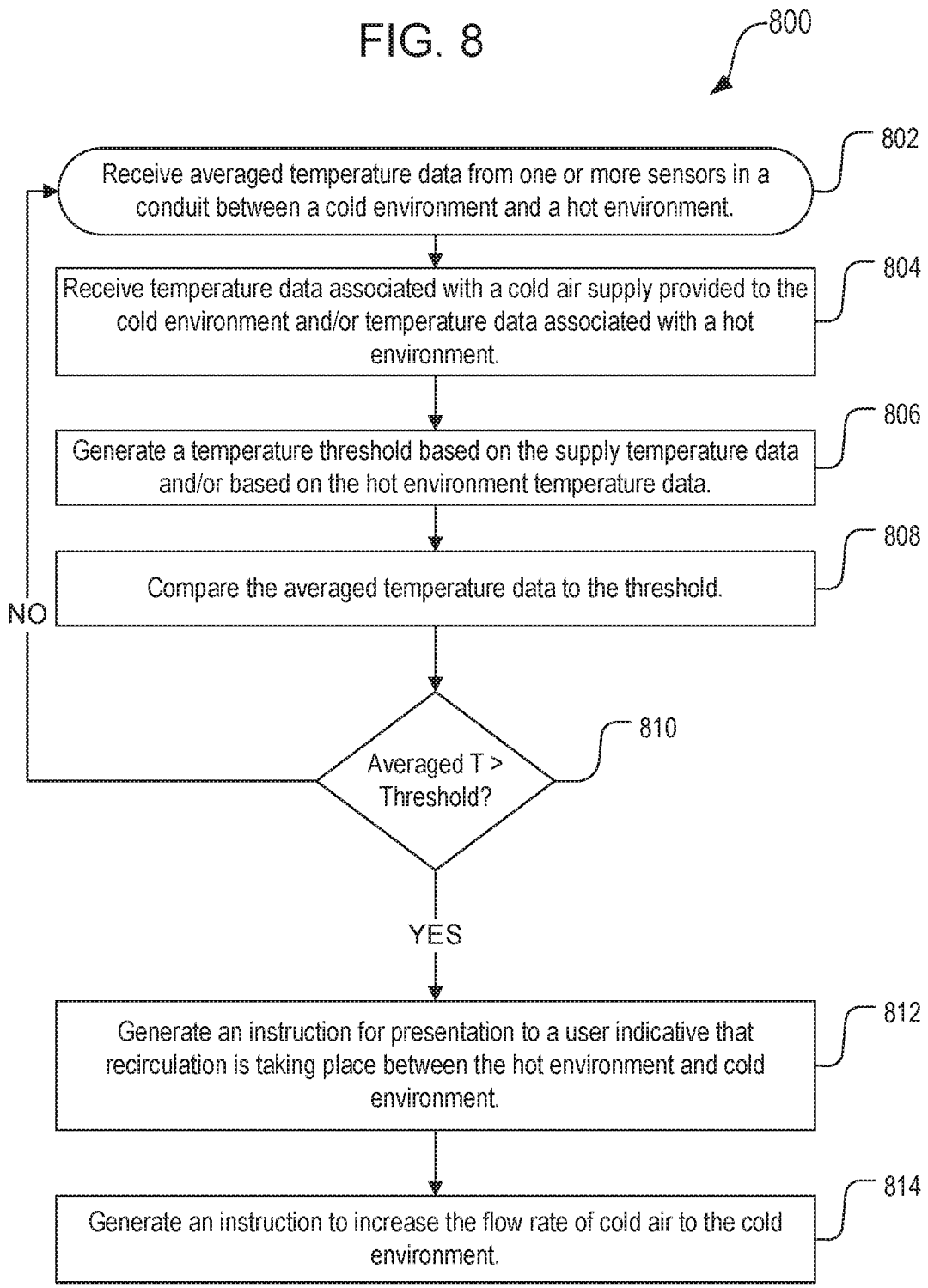
FIG. 8 illustrates a first example process for controlling a cooling system employing differential temperature-based pressure monitoring in conjunction with one or more differential temperature-based pressure monitoring inserts.

FIG. 8 illustrates a first example process 800 for controlling a cooling system employing differential temperature-based pressure monitoring in conjunction with one or more differential temperature-based pressure monitoring inserts and an operating temperature threshold. Steps shown in the example process 800 can be implemented in accordance with systems for cooling one or more electronic components, for example as shown in systems 100, 200, or 300 of FIG. 1, 2, or 3, and in conjunction with a bypass conduit or insert as described with reference to any of FIGS. 4-7. In particular, the process 800 relates to detecting a direction of a flow of air flowing through a conduit.

In various embodiments, the system can receive averaged temperature data from an averaging sensor passed through a conduit between a cold environment and a hot environment (act 802). The average temperature data can be data obtained by way of, e.g., an elongate, averaging sensor such as sensor 440 (FIG. 4) that spans a monitoring insert between a cold aisle and hot environment, in which case the temperature is largely averaged by hardware. As discussed above, such averaging sensors are influenced by temperatures across their length, and are therefore less susceptible to error due to temporary spikes or drops in temperature due to local airflow irregularities. In some embodiments, the average temperature data can be obtained by way of averaging data from multiple point temperature sensors, such as sensors 740-1, 740-2, as shown in FIG. 7. In such cases, the average temperature data can include a mean of the two or more point temperatures, a weighted mean, or other suitable function.

The system can receive temperature data associated with a cold air supply provided to the cold environment and/or temperature data associated with a hot environment (act 804). A temperature threshold or temperature range can be generated based on the supply temperature data and/or based on the hot environment temperature data (act 806). For example, in some embodiments, the supply temperature data alone may be used to set a temperature threshold or range, e.g. with a set threshold or set point positioned several degrees warmer, e.g. 1-1.7° C. (2-3° F.) offset from the supply temperature. This temperature range or set-point configuration can be used to drive a closely controlled system in which a small amount of deviation from the supplied air temperature is allowed.

In various other embodiments, the temperature range or set-point can be set farther from the supply temperature. For example, for embodiments of the monitoring inserts that use a long extension of an averaging sensor, the temperature range or set-point can be established at range on the order of 3.8-4.4° C. (7-8° F.), or more, offset from the supply temperature. In some other embodiments, the temperature range or set point can be set based on a temperature of the hot environment or external temperature as well. For example, where the external temperature is relatively low (e.g., 10-15° C. or 50-60° F.), the temperature range for controlling the cooling system can be very broad, e.g., on the order of 8.3° C. (or about 15° F.) higher than the supply air temperature. Conversely, a higher environmental or supply temperature will require a narrow control window for managing the air temperature.

When the threshold temperature or temperature range is established, the system can compare the averaged temperature data to the threshold or range (act 808). If the averaged temperature does not exceed the threshold (act 810), the cooling system is adequately supplying air to cool the cold environment, and can resume monitoring. If the averaged temperature does exceed the threshold or range (act 810), the system can generate an instruction for presentation to a user indicative that recirculation is taking place between the hot environment and cold environment (act 812), and can generate an instruction to an air handler or air supply to increase the flow rate of cold air to the cold environment (act 814).

The methods described with reference to FIG. 8 can be performed in conjunction with a system that detects an average temperature across the conduit (e.g. averaging sensor 240) or by way of a system with multiple sensors (e.g. sensors 740-1, 740-1 as shown in FIG. 7) used to obtain an average temperature. The use of the averaged temperature promotes control stability, and allows the system to capture velocity of the flow of air through the conduit to the extent that the difference between the averaged temperature data obtained by an averaging and the cold air supply temperature (or other threshold temperature) is indicative of the degree of mixing that has occurred in the conduit. Reducing this sensitivity also reduces the likelihood of the system overshooting a target pressure when the rate of the cold air supply is adjusted. However, similar methods can employ multiple temperature sensors, as described below with reference to FIG. 9.

Figure 9:
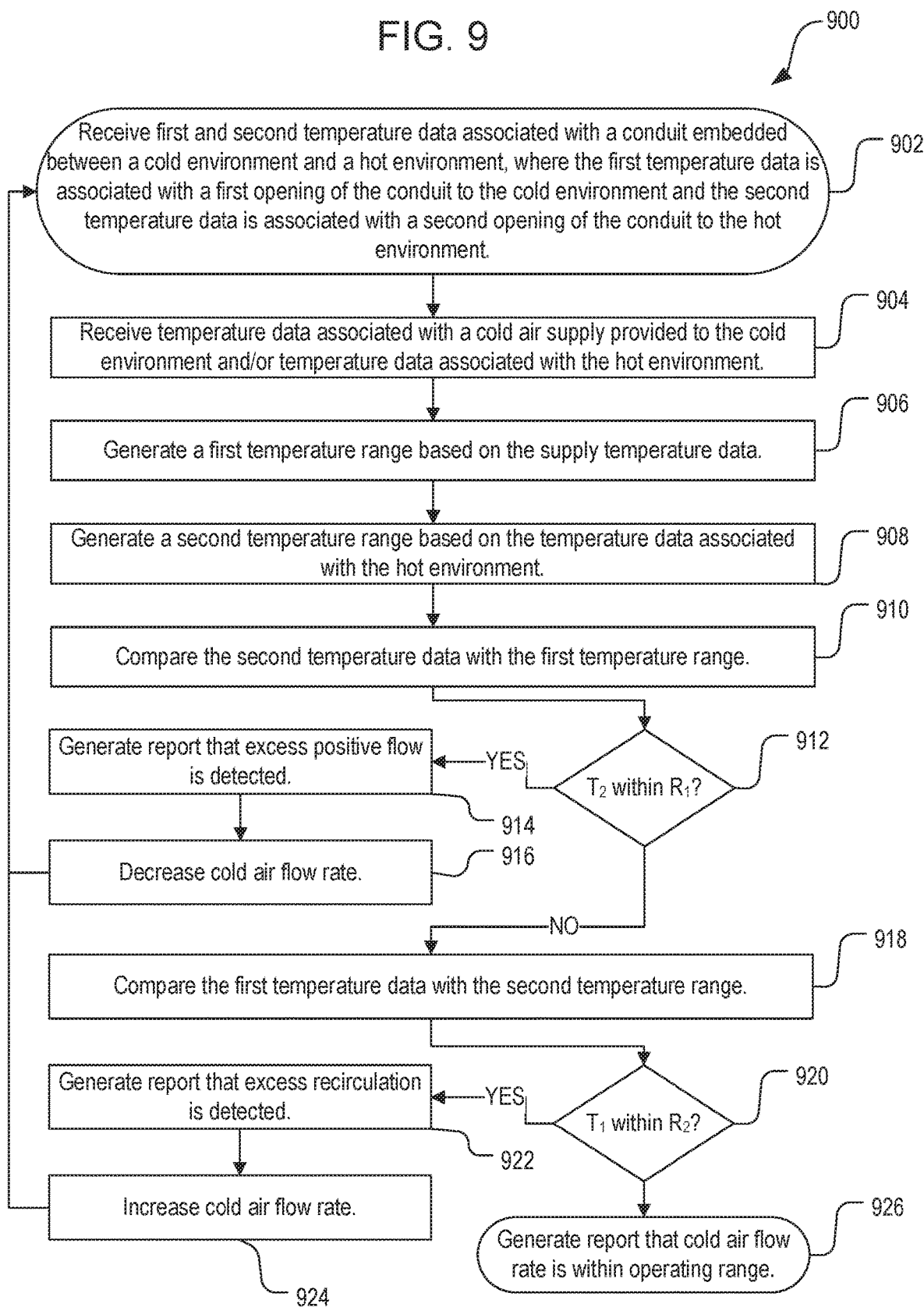
FIG. 9 illustrates a second example process for controlling a cooling system employing differential temperature-based pressure monitoring in conjunction with one or more differential temperature-based pressure monitoring inserts.

FIG. 9 illustrates a second example process 900 for controlling a cooling system employing differential temperature-based pressure monitoring in conjunction with one or more differential temperature-based pressure monitoring inserts based on an operating temperature range and with multiple temperature sensors. Steps shown in the example process 800 can be implemented in accordance with systems for cooling one or more electronic components, for example as shown in systems 100, 200, or 300 of FIG. 1, 2, or 3, and in conjunction with a bypass conduit or insert as described with reference to any of FIGS. 4-7. In particular, the process 900 relates to detecting a direction and strength or relative velocity of a flow of air flowing through a conduit.

First, the system can receive first and second temperature data associated with a conduit embedded between a cold environment and a hot environment, where the first temperature data is associated with a first opening of the conduit to the cold environment and the second temperature data is associated with a second opening of the conduit to the hot environment (act 902). The system can also receive temperature data associated with a cold air supply provided to the cold environment, temperature data associated with the hot environment, or both (act 904). This environmental data can be used to generate a first temperature range based on the supply temperature data (act 906). In general, a temperature range is associated with a set point against which the temperature of air flowing in the conduit is compared, with the aim of increasing or decreasing the flow rate of the flow of air automatically when the temperature falls out of the range. Likewise, a second temperature range can be generated based on the temperature data associated with the hot environment (act 908). These two temperature ranges include, respectively, a cold environment temperature and a hot environment temperature, and generally do not overlap.

The first and second temperature data can be compared with the temperature ranges to determine the direction and strength of the flow of air through the conduit. For example, in a first comparison step, the second temperature data associated with the temperature sensor near the hot environment is compared with the first temperature range that is associated with the cold environment (act 910). If this second temperature is within the first temperature range (act 912), the system can determine that the excess airflow is passing from the cold environment to the hot environment and overwhelming the effect of local airflow, and generate a report accordingly to indicate that an excess cold airflow is detected (act 914). In conjunction with detecting this excess airflow, the system can cause an air handler to decrease cold air flow rate (act 916).

In a second comparison step, the system can compare the first temperature data associated with the temperature sensor near the cold environment with the second temperature range, which corresponds to the hot environment (act 918). If the first temperature is within the second range (act 920), the system can determine that excess recirculation is occurring from the hot environment to the cold environment, indicative of underpressure in the cold environment. The system can then generate a report that excess recirculation is detected (act 922), and cause an air handler to increase the flow rate of cold air (act 924). If, however, the temperature sensors generate value with a sufficiently high delta, then neither case may be occurring, in which case the system can determine that the pressure difference is within an operating range and generate a report to that effect (act 926).

FIG. 10 illustrates a third example process 1000 for controlling a cooling system employing differential temperature-based pressure monitoring in conjunction with one or more differential temperature-based pressure monitoring inserts. Steps shown in the example process 800 can be implemented in accordance with systems for cooling one or more electronic components, for example as shown in systems 100, 200, or 300 of FIG. 1, 2, or 3, and in conjunction with a bypass conduit or insert as described with reference to any of FIGS. 4-7. In particular, the process 1000 relates to adjusting a control temperature range based on component temperatures. The process 1000 can be used in conjunction with either of the processes 800, 900 discussed above.

In various embodiments, the system can receive temperature data from one or more sensors embedded in a conduit between a cold environment and a hot environment (act 1002). The system can then receive additional temperature data associated with an electronic component positioned between the cold environment and hot environment (act 1004) and determine, based on the temperature data, whether the electronic component is within an operating temperature range (act 1006), which may be any suitable preferred range for operating the electronic devices. If all of the components queried are operating within the range, the system can determine that sufficient cooling is provided, and can incrementally adjust the control temperature range upward (act 1010). This adjustment will allow the system to run at a slightly higher temperature, at which point the system will cause the flow rate of cold air to decrease, resulting in lower energy expenditure on cooling. The system can iteratively perform this or similar optimization tasks until a component temperature falls outside the operating temperature range (act 1008), which indicates that the optimal flow rate of cold air has been found and passed. In this case, the system can readjust the control temperature downward, or alternatively back to a last known effective flow rate (act 1014).

In addition to continuous optimization, systems described herein can use iterative machine learning to improve the stability of controls and to automate the determination of optimal control temperature ranges. For example, FIG. 11 illustrates a fourth process 1100 for controlling a cooling system that employs differential temperature-based pressure monitoring in conjunction with one or more monitoring inserts and an iterative correction process. Steps shown in the example process 800 can be implemented in accordance with systems for cooling one or more electronic components, for example as shown in systems 100, 200, or 300 of FIG. 1, 2, or 3, and in conjunction with a bypass conduit or insert as described with reference to any of FIGS. 4-7.

As discussed above, the environmental temperature can influence the appropriate pressure drop and concomitant cold air supply rate needed to maintain the electronic components at an operational temperature. A machine learning method can be applied based on an environmental temperature or other factors in order to iteratively generate optimal cold air flow rates for each set of environmental conditions. For example, according to some embodiments, the system can receive temperature data from one or more sensors embedded in a conduit between a cold environment and a hot environment (act 1102), and receive temperature data associated with an electronic component positioned between hot cold environment and hot environment (act 1104). The system can also receive environmental data corresponding to, e.g., a supply air temperature or hot environment temperature (act 1106). The system can periodically increase or decrease a control temperature range from an initial control temperature range to an adjusted control temperature range, which may propagate to cause a reduction or increase in the cold air flow rate (act 1108). Once the change in cold air flow rate has occurred, the air flow rate can be allowed to stabilize based on the adjusted control temperature range (act 1110).

Once stable, the system can determine whether the electronic component is within an operating temperature range (act 1112). If the component has fallen outside the operating temperature range (act 1114), or has otherwise been required to engage protective measures such as an increased local fan speed, the system can determine that the adjusted temperature range is not needed, and can revert to a previous control temperature range and allow the flow rate of cold air to reset (act 1118). If, however, the system detects that the component remains operating within the operating temperature range (act 1114), the system can generate and store an instruction that associates the particular environmental condition (e.g., supply air temperature, hot environment temperature, a combination of the two, or other environmental condition) with the particular adjusted range of the control temperature range. In some embodiments, the stored instruction can be in the form of a condition table that correlates sets of environmental or operating conditions (e.g., air supply temperature, hot environment temperature, humidity, environmental air pressure, and other conditions) with such empirically determined parameters as the cold air flow rate. Such tables can be continually updated and modified during operation of the system in order to provide gradual improvements to the general operation of the system, and can be used to determine initial set points for operating the cooling system, or similar cooling systems, or to predictively adjust the cold air flow rate in response to detecting a change in an environmental or operating condition even when a change in the pressure difference between the cold and hot environments has not yet been detected (act 1120). This adjusted range can form the basis of automatic adjustment of the control temperature range based on the environmental factors. In some embodiments, the system will periodically walk through this training cycle, e.g. at regular intervals or in response to a change in the environmental conditions.

Some or all of the processes 800, 900, 1000, and 1100 (or any other processes described herein, or variations, and/or combinations thereof) may be performed under the control of one or more computer systems configured with executable instructions and may be implemented as code (e.g., executable instructions, one or more computer programs, or one or more applications) executing collectively on one or more processors, by hardware or combinations thereof. The code may be stored on a computer-readable storage medium, for example, in the form of a computer program comprising a plurality of instructions executable by one or more processors. The computer-readable storage medium may be non-transitory.

Various computing environments may be used, as appropriate, to implement various embodiments as described herein including web- or cloud-based computing environments, computing environments based on local controllers, or combinations of the above. User or client devices can include any of a number of general purpose personal computers, such as desktop or laptop computers running a standard operating system, as well as cellular, wireless and handheld devices running mobile software and capable of supporting a number of networking and messaging protocols. Such an environment also can include a number of workstations running any of a variety of commercially-available operating systems and other known applications for purposes such as development and database management. These workstations also can include other electronic devices, such as dummy terminals, thin-clients, gaming systems and other devices capable of communicating via a network and used for communicating with sensors, displays, actuators, and user interfaces, among other devices.

For example, user interfaces (such as interface 148, FIG. 1) can include any appropriate device operable to send and receive requests, messages, or information over an appropriate network and convey information back to a user of the device. Examples of such devices include portable displays, personal computers, cell phones, handheld messaging devices, laptop computers, set-top boxes, personal data assistants, electronic book readers, and the like. The network can include any appropriate network, including an intranet, the Internet, a cellular network, a local area network, or any other such network or combination thereof. Components used in conjunction with such a network can depend at least in part upon the type of network and/or environment selected. Protocols and components for communicating via such a network are well known and will not be discussed herein in detail. Communication over the network can be enabled by wired or wireless connections and combinations thereof.

Suitable computing environments can include, in various embodiments, a server and data store. It should be understood that there can be several servers, layers, or other elements, processes, or components, which may be chained or otherwise configured, which can interact to perform tasks such as obtaining data, processing said data, and communicating data or with users. For example, according to various embodiments, a controller such as controller 102 (FIG. 1) can include a server and/or a virtual machine emulated by a server. As used herein the term "data store" refers to any device or combination of devices capable of storing, accessing, and retrieving data, which may include any combination and number of data servers, databases, data storage devices, and data storage media, in any standard, distributed, or clustered environment. The server can include any appropriate hardware and software for integrating with the data store as needed to execute aspects of one or more applications for the client device, handling a majority of the data access and logic for an application. The server provides access control services in cooperation with the data store and is able to generate content such as text, graphics, audio, and/or video to be transferred to the user, which may be served to the user by the Web server in the form of HyperText Markup Language ("HTML"), Extensible Markup Language ("XML"), or another appropriate structured language in this example. It should be understood that servers are not required and are merely example components, as structured code discussed herein can be executed on any appropriate device or host machine as discussed elsewhere herein.

The data store can include several separate data tables, databases or other data storage mechanisms and media for storing data relating to a particular aspect. For example, the data store can include a mechanism for storing data for reporting, analysis, or other such purposes. The data store is operable, through logic associated therewith, to receive instructions and obtain, update or otherwise process data in response thereto.

Each server typically will include an operating system that provides executable program instructions for the general administration and operation of that server and typically will include a computer-readable storage medium (e.g., a hard disk, random access memory, read only memory, etc.) storing instructions that, when executed by a processor of the server, allow the server to perform its intended functions. Suitable implementations for the operating system and general functionality of the servers are known or commercially available and are readily implemented by persons having ordinary skill in the art, particularly in light of the disclosure herein.

A computing environment according to various embodiments can be a distributed computing environment utilizing several computer systems and components that are interconnected via communication links, using one or more computer networks or direct connections. However, it will be appreciated by those of ordinary skill in the art that the embodiments discussed above could operate equally well in a computing environment having fewer or a greater number of components, including systems operated under the control of a single computing device in communication with any suitable combination of the various sensors, input/output devices and/or actuators discussed herein.

Most embodiments utilize at least one network that would be familiar to those skilled in the art for supporting communications using any of a variety of commercially-available protocols, such as Transmission Control Protocol/Internet Protocol ("TCP/IP"), Open System Interconnection ("OSI"), File Transfer Protocol ("FTP"), Universal Plug and Play ("UpnP"), Network File System ("NFS"), Common Internet File System ("CIFS"), and AppleTalk. The network can be, for example, a local area network, a wide-area network, a virtual private network, the Internet, an intranet, an extranet, a public switched telephone network, an infrared network, a wireless network, and any combination thereof.

In embodiments utilizing a Web server, the Web server can run any of a variety of server or mid-tier applications, including Hypertext Transfer Protocol ("HTTP") servers, FTP servers, Common Gateway Interface ("CGP") servers, data servers, Java servers, and business application servers. The server(s) also may be capable of executing programs or scripts in response to requests from user devices, such as by executing one or more Web applications that may be implemented as one or more scripts or programs written in any programming language, such as Java®, C, C#, or C++, or any scripting language, such as Perl, Python, or TCL, as well as combinations thereof. The server(s) may also include database servers, including without limitation those commercially available from Oracle®, Microsoft®, Sybase®, and IBM®.

Computing environments as discussed herein can include a variety of data stores and other memory and storage media as discussed above. These media can reside in a variety of locations, such as on a storage medium local to (and/or resident in) one or more of the computers or remote from any or all of the computers across the network. In a particular set of embodiments, the information may reside in a storage-area network ("SAN") familiar to those skilled in the art. Similarly, any necessary files for performing the functions attributed to the computers, servers, or other network devices may be stored locally and/or remotely, as appropriate. Where a system includes computerized devices, each such device can include hardware elements that may be electrically coupled via a bus, the elements including, for example, at least one central processing unit ("CPU"), at least one input device (e.g., a mouse, keyboard, controller, touch screen, or keypad), and at least one output device (e.g., a display device, printer, or speaker). Such a system may also include one or more storage devices, such as disk drives, optical storage devices, and solid-state storage devices such as random access memory ("RAM") or read-only memory ("ROM"), as well as removable media devices, memory cards, flash cards, etc.

Suitable media can also include a computer-readable storage media reader, a communications device (e.g., a modem, a network card (wireless or wired)), an infrared communication device, etc.), and working memory as described above. The computer-readable storage media reader can be connected with, or configured to receive, a computer-readable storage medium, representing remote, local, fixed, and/or removable storage devices as well as storage media for temporarily and/or more permanently containing, storing, transmitting, and retrieving computer-readable information. The system and various devices also typically will include a number of software applications, modules, services, or other elements located within at least one working memory device, including an operating system and application programs, such as a client application or Web browser. It should be appreciated that alternate embodiments may have numerous variations from that described above. For example, customized hardware might also be used and/or particular elements might be implemented in hardware, software (including portable software, such as applets), or both. Further, connection to other computing devices such as network input/output devices may be employed.

Storage media computer readable media for containing code, or portions of code, can include any appropriate media known or used in the art, including storage media and communication media, such as but not limited to volatile and non-volatile, removable and non-removable media implemented in any method or technology for storage and/or transmission of information such as computer readable instructions, data structures, program modules, or other data, including RAM, ROM, Electrically Erasable Programmable Read-Only Memory ("EEPROM"), flash memory or other memory technology, Compact Disc Read-Only Memory ("CD-ROM"), digital versatile disk (DVD), or other optical storage, magnetic cassettes, magnetic tape, magnetic disk storage, or other magnetic storage devices, or any other medium which can be used to store the desired information and which can be accessed by a system device. Based on the disclosure and teachings provided herein, a person of ordinary skill in the art will appreciate other ways and/or methods to implement the various embodiments.

The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Various embodiments of this disclosure are described herein, including the best mode known to the inventors for carrying out the disclosure. Variations of those embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. A system for controlling airflow in a datacenter, the datacenter comprising a hot environment, a cold environment adjacent to the hot environment, a containment element separating the cold environment from the hot environment, a cold air outlet providing a flow of air to the cold environment, and heat-generating electronic devices positioned between the hot environment and the cold environment and configured to take in cold air from the cold environment and exhaust hot air to the hot environment, the system comprising:
   a conduit positioned at the containment element and in fluid communication with the cold environment and the hot environment, wherein the conduit has a first opening that opens to the cold environment and a second opening that opens to the hot environment and wherein the conduit has an internal dimension that is from 1/96 to 1/4 of a length of the conduit;
   an elongate averaging temperature sensor having a first end and a second end, wherein the elongate averaging temperature sensor extends from the first end to the second end, wherein the first end is disposed proximate to the first opening, wherein the second end is disposed proximate to the second opening, and wherein the elongate averaging temperature sensor generates an average temperature signal indicative of an average temperature of a flow of air flowing through the conduit; and
   a controller comprising at least one processor and tangible memory containing non-transitory instructions that, when executed by the processor, cause the controller to:
      determine, based on the average temperature signal, a direction of the flow of air flowing in the conduit; and
      control a rate of airflow provided to the cold environment via the cold air outlet based on the average temperature signal.

2. The system of claim 1, wherein the elongate averaging temperature sensor extends outwardly from the conduit from the first opening and from the second opening.

3. The system of claim 1, wherein the controller is further configured to:
   determine a target temperature or a target temperature range based on a temperature of air in the cold environment and a temperature of air in the hot environment; and
   control the rate of airflow provided to the cold environment via the cold air outlet based on a comparison of the average temperature of the flow of air flowing through the conduit and the target temperature or the target temperature range.

4. The system of claim 3, further comprising an air handler fluidly connected with the cold air outlet, wherein the controller is further configured to:
   in response to detecting that the average temperature of the flow of air flowing through the conduit is lower than the target temperature or the target temperature range, instruct the air handler to reduce a flow rate of the airflow to the cold environment; and
   in response to detecting that the average temperature of the flow of air flowing through the conduit is higher than the target temperature or the target temperature range, instruct the air handler to increase the flow rate of the airflow to the cold environment.

5. The system of claim 1, wherein the cold environment is a cold aisle, the system further comprising a plurality of conduits, including the conduit, spaced along a length of the cold aisle, wherein:
   each conduit of the plurality of conduits has a respective elongate averaging temperature sensor that generates a respective average temperature signal indicative of an average temperature of a flow of air flowing through the respective conduit; and
   the controller is further configured to:
      determine, based on the respective average temperature signals, a plurality of directions of flow of air associated with the plurality of conduits.

6. The system of claim 1, wherein the first end extends outside of the first opening of the conduit, and wherein the second end extends outside of the second opening of the conduit.

7. The system of claim 1, wherein the conduit comprises a first set of perforations in the conduit proximate the first opening, and a second set of perforations in the conduit proximate the second opening, the first and second sets of perforations arranged to increase circulation of air from the cold and hot environments to the first end of the elongate averaging temperature sensor and the second end of the elongate averaging temperature sensor, respectively.

8. The system of claim 7, wherein the first set of perforations is positioned along an upper portion of the conduit and wherein the second set of perforations is positioned along a lower portion of the conduit.

9. A method, comprising:
   generating, by an elongate averaging temperature sensor, an average temperature signal indicative of an average temperature of a flow of air through a conduit that fluidly connects a hot environment and a cold environment, wherein the hot environment and the cold environment are separated by a containment element, wherein the conduit has a first opening that opens to the cold environment and a second opening that opens to the hot environment, wherein the conduit has an internal dimension that is from 1/96 to 1/4 of a length of the conduit, wherein the elongate averaging temperature sensor has a first end and a second end, wherein the elongate averaging temperature sensor extends from the first end to the second end, wherein the first end is disposed proximate to the first opening, and wherein the second end is disposed proximate to the second opening;
   determining the average temperature based on the average temperature signal;
   determining a temperature difference between the average temperature and a target temperature or a temperature difference by which the average temperature is outside of a target temperature range; and
   causing an air handler to adjust a flow rate of a supply of cold air supplied to the cold environment based on the temperature difference.

10. The method of claim 9, further comprising:
   receiving supply air temperature data associated with the supply of cold air;
   setting the target temperature or the target temperature range based on the supply air temperature data;
   in response to detecting that the average temperature is cooler than the target temperature or below the target temperature range, causing the air handler to decrease the flow rate of the cold air supplied to the cold environment; or in response to detecting that the average temperature is hotter than the target temperature or above the target temperature range, causing the air handler to increase the flow rate of the cold air supplied to the cold environment.

11. The method of claim 10, further comprising:

in response to detecting that the average temperature is equal to the target temperature or is within the target temperature range, causing the air handler to maintain the flow rate of the cold air supplied to the cold environment.

12. The method of claim 9, further comprising:

receiving component temperature data associated with an operational temperature of an electronic component that is positioned between the cold environment and the hot environment and that takes in air from the cold environment for cooling and exhausts hot air to the hot environment;

detecting, based on the component temperature data, whether the electronic component is within a predetermined operating temperature; and in response to detecting that the electronic component is warmer than the predetermined operating temperature, decreasing the target temperature or adjusting the target temperature range downward.

13. The method of claim 12, further comprising:

receiving environmental temperature data associated with the hot environment or with the supply of cold air;

adjusting the target temperature or the target temperature range based on the environmental temperature data.

\* \* \* \* \*